United States Patent
Ayyapureddi

(10) Patent No.: US 11,562,783 B2
(45) Date of Patent: Jan. 24, 2023

(54) APPARATUSES, SYSTEMS, AND METHODS FOR RESETTING ROW HAMMER DETECTOR CIRCUIT BASED ON SELF-REFRESH COMMAND

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/412,082

(22) Filed: Aug. 25, 2021

(65) Prior Publication Data

US 2022/0068364 A1 Mar. 3, 2022

Related U.S. Application Data

(60) Provisional application No. 63/071,344, filed on Aug. 27, 2020.

(51) Int. Cl.
*G11C 11/40* (2006.01)
*G11C 11/406* (2006.01)
*G11C 11/4063* (2006.01)

(52) U.S. Cl.
CPC .... *G11C 11/40615* (2013.01); *G11C 11/4063* (2013.01); *G11C 11/40618* (2013.01); *G11C 11/40622* (2013.01)

(58) Field of Classification Search
CPC .......... G11C 11/40615; G11C 11/4618; G11C 11/40622; G11C 11/4063
See application file for complete search history.

(56) References Cited

U.S. PATENT DOCUMENTS

| 10,790,005 | B1* | 9/2020 | He | G11C 7/24 |
| 2018/0342282 | A1* | 11/2018 | Morgan | G11C 11/40603 |
| 2022/0069992 | A1* | 3/2022 | Ayyapureddi | G06F 11/1068 |

* cited by examiner

*Primary Examiner* — Han Yang
(74) *Attorney, Agent, or Firm* — Dorsey & Whitney LLP

(57) ABSTRACT

Apparatuses, systems, and methods for reset of row hammer detector circuits. A row hammer detector circuit includes a hash circuit configured to store a hash key and provide a first count value based on a hash between the hash key and a row address corresponding to a row of memory cells of a memory array. The row hammer detector circuit is configured to provide a match signal in response to the count value exceeding a threshold to cause a targeted refresh of a victim row adjacent the row of memory cells. In response to exit from a self-refresh mode, the hash circuit is configured to update the stored hash key with a new hash key.

22 Claims, 6 Drawing Sheets

APPARATUSES, SYSTEMS, AND METHODS FOR RESETTING ROW HAMMER DETECTOR CIRCUIT BASED ON SELF-REFRESH COMMAND

CROSS-REFERENCE TO RELATED APPLICATION

This application claims the filing benefit of U.S. Provisional Application No. 63/071,344, filed Aug. 27, 2020. This application is incorporated by reference herein in its entirety and for all purposes.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Repeated access to a particular memory cell or group of memory cells (often referred to as a 'row hammer') may cause an increased rate of data degradation in nearby memory cells. Memory cells affected by the row hammer effect may be identified and refreshed as part of a targeted refresh operation.

DETAILED DESCRIPTION

Figure 1:
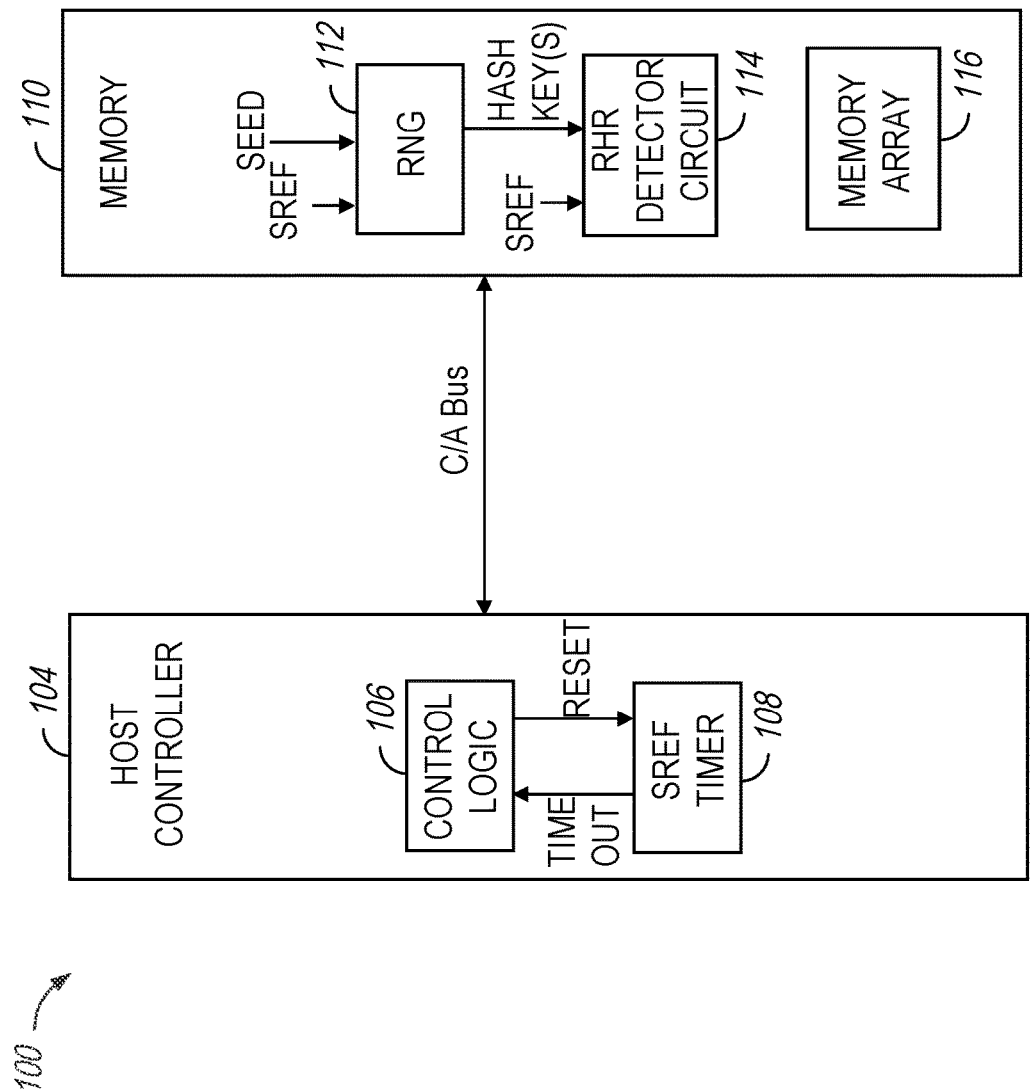
FIG. 1 is a block diagram of a memory system according an embodiment of the disclosure.

This application describes examples of operation of a memory to update hash keys used in row hammer detector circuitry in response to receipt of a self-refresh command from a memory controller. Typically, in response to receipt of a command from a memory controller to perform a self-refresh (e.g., a self-refresh command), a memory may enter a self-refresh mode or state (e.g., or an idle mode or state) and perform a refresh operation on all rows of one or more banks of a memory cell array of the memory. In some examples, the self-refresh command may identify banks of the memory cell array on which to perform the self-refresh operation. In some examples, the self-refresh command may indicate a self-refresh of all rows of the memory cell array.

While in the self-refresh mode, the memory may cease performing access operations corresponding to memory access requests (e.g., read or write requests). Upon exit from the self-refresh mode, the memory may resume memory access operations in response to access requests received from the memory controller.

In volatile memory, information may be stored by placing a charge across a capacitive element in a memory cell. Over time, the charge across the capacitive element in a memory cell may decay; resulting in the information being lost if enough charge had dissipated. In order to prevent information from being lost or corrupted due to this decay, the memory may carry out a refresh operations. During a refresh operation, information may be rewritten to the wordline to restore a cell to its initial state. Generally, the memory may perform two types of refresh operations, e.g., automatic refresh operations or a self-refresh operations. The type of refresh operation may be determined based on a command received from a memory controller (e.g., an auto-refresh command or a self-refresh command)

An automatic refresh operation is a background refresh operation where refresh operations for individual rows of memory cells interleaved with performing normal access operations (e.g., read and write operations). That is, during an automatic refresh operation, the memory intermittently refreshes rows of memory cells of the memory array in a systematic fashion while remaining available to perform normal access operations. Auto-refresh operations may be performed on the wordlines of the memory in a sequence such that over time each of the wordlines of the memory are refreshed at a rate faster than the expected rate of data degradation.

A self-refresh operation may include the memory entering a dedicated self-refresh mode (e.g., or an idle mode) where each row of one or more banks of the memory array are refreshed. While in the self-refresh mode, the memory may be unavailable to perform normal access operations (e.g., the memory is effectively offline).

Repeated access (e.g., a row hammer) to a particular row of memory (e.g., an aggressor row) may cause an increased rate of decay in rows (e.g., victim rows) that are close or adjacent to the aggressor row. These repeated accesses may be part of a deliberate attack against the memory and/or may be due to 'natural' access patterns of the memory. The increased rate of decay in the victim rows may require that they be refreshed earlier than normal to avoid losing stored data. When the memory detects a row hammer attack, it may perform a targeted refresh operation directed to one or more victim rows in lieu of an automatic refresh operation.

A memory may detect a row hammer attack based on repeated access of an aggressor row at a very high rate. In some examples, a row hammer detector circuit (e.g., aggressor detector circuit) of the memory may include one or more hash circuits of varying bit sizes (e.g., number of bits in a hash key), which are each configured to hash a received row address with a respective hash key. That is, the row hammer detector circuit may include a first hash circuit configured to hash the row address into an n-bit hash using an n-bit hash key, and a second hash circuit configured to hash the row address into an m-bit hash using an m-bit has key. The row hammer detector circuit may change a first count value associated with the value of the n-bit hash and a second count value associated with the value of the m-bit hash. Based on the value of these counts, the row hammer detector circuit may determine if the row address is suspected of a row hammer attack.

The respective sizes of the hash circuits are smaller than the number of bits of the row address. Because the hash circuits use fewer bits than the row address, hashing of row addresses may lead to collisions, where multiple addresses may be associated with the same hash value (e.g., the same count value). Thus, if the hash keys are known, an attacker may circumvent row hammer detection by sending access requests with row address combinations that circumvent detection. To mitigate against hash key detection, the memory may include one or more random number generators to generate the hash keys. Typically, the hash keys may be generated during a power cycle or reset of the memory. However, in some applications, a memory may remain operational without a power cycle or reset for long periods of time, which may provide an opportunity for an attacker to determine the hash keys. Therefore, in some examples, the memory may be configured to reset the hash keys in response to a self-refresh operation. For example, the memory may be configured to reset the hash keys in response to entering a self-refresh mode or upon exiting a self-refresh mode. The hash keys may be updated by obtaining new hash key values from the one or more random number generators. In some examples, to ensure the hash keys values are occasionally updated over a preset time period, a memory controller may issue at least one self-refresh command within a predetermined time period, such as at least once an hour, once every 6 hours, once every 12 hours, once a day, once over a predetermined number of days, once a week, once a month, etc. Forcing updates to hash keys at time predetermined interval may mitigate an ability of an attacker to discover hash keys for use in exploiting the hash circuits and circumventing row hammer attack detection.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

FIG. 1 is a block diagram of a memory system 100 according an embodiment of the disclosure. The memory system 100 may include a host controller 104 configured to communicate with a memory 110 via a command and address bus C/A. The memory system 100 depicted in FIG. 1 is simplified for clarity, and it is appreciated that both the host controller 104 and the memory 110 will include additional circuitry without departing from the scope of the disclosure.

The host controller 104 may include control logic 106 and a self-refresh timer 108. The control logic 106 may include input/output circuitry configured to provide commands and addresses to the memory 110 to cause the memory 110 to perform various operations, such as access operations, refresh operations, etc. In some examples, the control logic 106 may be configured to issue a self-refresh command to the memory 110 at some minimum interval based on the self-refresh timer 108. The minimum interval may include at least once an hour, at least once every 6 hours, at least once every 12 hours, at least once a day, at least once over a predetermined number of days, at least once a week, at least once a month, or some other minimum interval, etc.

The self-refresh timer 108 may be configured to provide a time out signal after expiration of a predetermined period of time based on the minimum interval after being reset by the control logic 106 via the reset signal. In some examples, the control logic 106 may provide the self-refresh command before receipt of the time out signal. In some examples, the control logic 106 may reset the self-refresh timer 108 whenever a self-refresh command is provided.

The memory 110 may include a volatile memory device, such as a DRAM device integrated on a single semiconductor chip. The memory 110 may include a random number generators 112, a row hammer detector circuit 114, and a memory array 116. The memory 110 may be configured to receive commands via the C/A bus causing it to carry out one or more refresh operations as part of a self-refresh mode or an automatic refresh mode. The automatic refresh mode is a background refresh mode where rows of the memory array 116 is refreshed intermittently with performance of memory access operations. The self-refresh mode is a refresh mode where the memory 110 is taken offline to refresh all rows of one or more banks of the memory array 116. In some embodiments, the memory 110 may enter the self-refresh mode in response to a self-refresh command or signal received via the C/A bus from a memory controller (not shown).

While in the automatic refresh mode, the row hammer detector circuit 114 is configured to detect a row hammer attack based on a pattern of repeated access of an aggressor row at a very high rate. In some examples, the row hammer detector circuit 114 may include one or more hash circuits of varying bit sizes (e.g., number of bits in a hash key), which are each configured to hash a received row address with a respective hash key. That is, the row hammer detector circuit 114 may include a first hash circuit configured to may hash the row address into an n-bit hash using an n-bit hash key, and a second hash circuit configured to hash the row address into an m-bit hash using an m-bit has key. The row hammer detector circuit 114 may change a first count value associated with the value of the n-bit hash and a second count value associated with the value of the m-bit hash. Based on the value of these counts, the aggressor detector circuit may determine if the row address is suspected of a row hammer attack.

The respective sizes of the hash circuits are smaller than the number of bits of the row address. Because the hash circuits use fewer bits than the row address, hashing of row addresses may lead to collisions, where multiple addresses may be associated with the same hash value (e.g., the same count value). Thus, if the hash keys are known, an attacker may circumvent row hammer detection by sending access requests with row address combinations that circumvent detection. To mitigate against hash key detection, the memory 110 may include one or more random number generators 112 to generate the hash keys. The random number generators 112 may use a seed value to initiate generation of the hash keys. In some examples, the seed value may be a last-received row address, a value programmed in the mode register or a fuse bank, or some other value.

Typically, the random number generators 112 may generate the hash keys during a power up sequence, or after reset of the memory 110. However, in some applications, the memory 110 may remain operational without a power cycle or reset for long periods of time, which may provide an opportunity for an attacker to determine the hash keys. Therefore, in some examples, the memory 110 may cause the random number generators 112 and the row hammer detector circuit 114 to generate and implement new hash keys in response to a self-refresh exit command received from the host controller 104. Because resetting of the hash keys may result in count values being reset, performing the reset after upon exit from the self-refresh mode may mitigate any previously-perpetuated row hammer attack, as every row will have been recently refreshed. In some other examples, the random number generators 112 may reset the hash keys in response to entering a self-refresh mode, rather than upon exiting a self-refresh mode.

Figure 2:
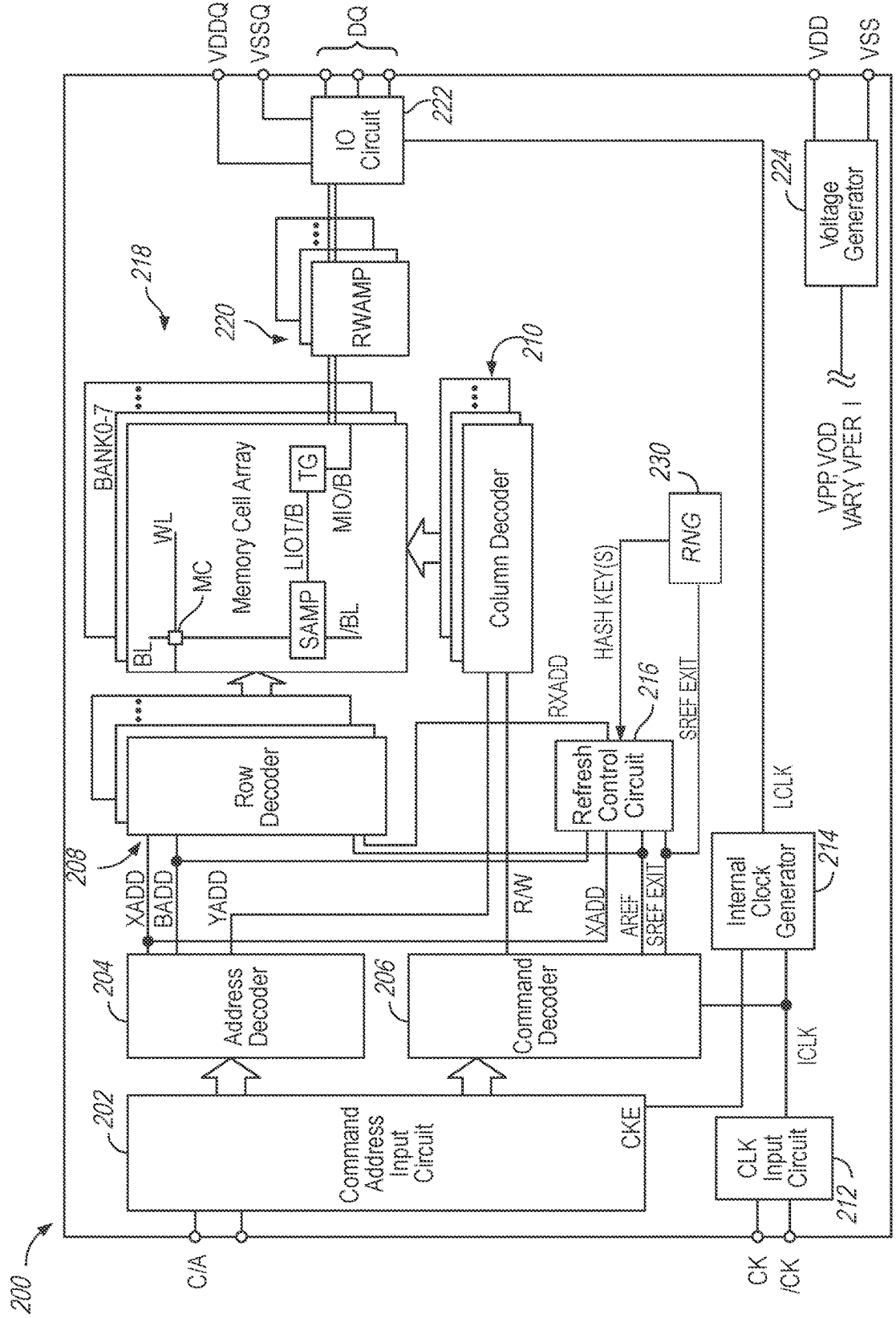
FIG. 2 is a block diagram of a semiconductor device according an embodiment of the disclosure.

FIG. 2 is a block diagram of a semiconductor device according an embodiment of the disclosure. The semiconductor device 200 may be a semiconductor memory device, such as a DRAM device integrated on a single semiconductor chip. The semiconductor device 200 may implement the memory 110, in some examples. The semiconductor device 200 may include a clock input circuit 212, an internal clock generator 214, a command and address command input circuit 202, an address decoder 204, a command decoder 206, a plurality of row decoders 208, a memory cell array 218 including sense amplifiers and transfer gates, a plurality of column decoders 210, a plurality of read/write amplifiers 220, an input/output (I/O) circuit 222, a refresh control circuit 216, a random number generators 230, and a voltage generator 224. The semiconductor device 200 may include a plurality of external terminals including address and command terminals coupled to command/address bus 210, clock terminals CK and /CK, data terminals DQ and DQS, and power supply terminals VDD and VSS.

The semiconductor device 200 includes a memory array 218. The memory array 218 is shown as including a plurality of memory banks. In the embodiment of FIG. 2, the memory array 218 is shown as including eight memory banks BANK0-BANK7. More or fewer banks may be included in the memory array 218 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 208 and the selection of the bit lines BL is performed by a column decoder 210. In the embodiment of FIG. 2, the row decoder 208 includes a respective row decoder for each memory bank and the column decoder 210 includes a respective column decoder for each memory bank. The bit lines BL are coupled to a respective sense amplifier (SAMP). Read data from the bit line BL is amplified by the sense amplifier SAMP, and transferred to read/write amplifiers over complementary local data lines (LIOT/B), transfer gate (TG), and complementary main data lines (MIOT/B) which are coupled to an error correction code (ECC) control circuit 220. Conversely, write data outputted from the ECC control circuit 220 is transferred to the sense amplifier SAMP over the complementary main data lines MIOT/B, the transfer gate TG, and the complementary local data lines LIOT/B, and written in the memory cell MC coupled to the bit line BL.

The semiconductor device 200 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 212. The external clocks may be complementary. The input circuit 212 generates an internal clock ICLK based on the CK and /CK clocks. The ICLK clock is provided to the command decoder 206 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data.

The C/A terminals may be supplied with memory addresses. The memory addresses supplied to the C/A terminals are transferred, via a command/address input circuit 202, to an address decoder 204. The address decoder 204 receives the address and supplies a decoded row address XADD to the row decoder 208 and supplies a decoded column address YADD to the column decoder 210. The address decoder 204 may also supply a decoded bank address BADD, which may indicate the bank of the memory array 218 containing the decoded row address XADD and column address YADD. The C/A terminals may be supplied with commands Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 206 via the command/address input circuit 202. The command decoder 206 includes circuits to decode the internal command signals to generate various internal signals and commands for performing operations. For example, the command decoder 206 may provide a row command signal to select a word line and a column command signal to select a bit line.

The device 200 may receive an access command which is a read command. When a read command is received, and a bank address, a row address and a column address are timely supplied with the read command, read data is read from memory cells in the memory array 218 corresponding to the row address and column address. The read command is received by the command decoder 206, which provides internal commands so that read data from the memory array 218 is provided to the read/write amplifiers 220. The read data is output to outside from the data terminals DQ via the input/output circuit 222.

The device 200 may receive an access command which is a write command. When the write command is received, and a bank address, a row address and a column address are timely supplied with the write command, write data supplied to the data terminals DQ is written to a memory cells in the memory array 218 corresponding to the row address and column address. The write command is received by the command decoder 206, which provides internal commands so that the write data is received by data receivers in the input/output circuit 222. Write clocks may also be provided to the external clock terminals for timing the receipt of the write data by the data receivers of the input/output circuit 222. The write data is supplied via the input/output circuit 222 to the read/write amplifiers 220, and by the read/write amplifiers 220 to the memory array 218 to be written into the memory cell MC.

The semiconductor device 200 may also receive commands causing it to carry out one or more refresh operations as part of a self-refresh mode or an automatic refresh mode. The automatic refresh mode is a background refresh mode where rows of the memory cell array 218 is refreshed intermittently with performance of memory access operations. The self-refresh mode is a refresh mode where the semiconductor device 200 is taken offline to refresh all rows of one or more banks BANK0-7 of the memory cell array 218. In some embodiments, the semiconductor device 200 may enter the self-refresh mode in response to a self-refresh command or signal received via the C/A bus from a memory controller (not shown). In some embodiments, the command decoder 206 may activate the refresh signal AREF may in response to entering the self-refresh mode or the automatic refresh mode. That is, the refresh signal AREF may be a pulse signal activated when the command decoder 206 receives the self-refresh command to indicate entry to the self-refresh mode or an automatic refresh command to enter the automatic refresh mode.

With respect to the self-refresh mode, the command decoder 206 may activate the refresh signal AREF once immediately upon entry into the self-refresh mode, and thereafter may be cyclically activated at desired internal timing. The refresh signal AREF may be used to control the timing of refresh operations during the self-refresh mode. Thus, refresh operations may continue automatically. In response to receipt of a self-refresh exit command received from the memory controller, the semiconductor device 200 may exit the self-refresh mode. In response to exit of the self-refresh mode, the command decoder 206 may stop the automatic activation of the refresh signal AREF and may issue a self-refresh exit signal SREF EXIT. The refresh signal AREF signal may be supplied to the refresh control circuit 216 and to the row decoders 208, and the SREF EXIT signal may be supplied to the refresh control circuit 216, the row decoders 208, and to the random number generators 230.

In either the self or automatic refresh mode, the refresh control circuit 216 supplies a refresh row address RXADD to the row decoder 208, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 208. In some embodiments, the number of wordlines represented by the refresh address RXADD may vary from one refresh address to another. The refresh control circuit 216 may control a timing of the refresh operation, and may generate and provide the refresh address RXADD. The refresh control circuit 216 may be controlled to change details of the refreshing address RXADD (e.g., how the refresh address is calculated, the timing of the refresh addresses, the number of wordlines represented by the address), or may operate based on internal logic.

While in the automatic refresh mode, the refresh control circuit 216 may selectively output a targeted refresh address (e.g., which specifies one or more victim address based on an aggressor) or an automatic refresh address (e.g., from a sequence of auto-refresh addresses) as the refresh address RXADD. Based on the type of refresh address RXADD, the row decoder 208 may perform a targeted refresh or auto-refresh operation. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit 216 may use some criteria to judge whether an address is an aggressor address, which may capture potential aggressor addresses rather than definitively determining which addresses are causing data degradation in nearby victims. For example, the refresh control circuit 216 may determine potential aggressor addresses based on a pattern of accesses to the addresses and this criteria may include some addresses which are not aggressors, and miss some addresses which are. Similar victim addresses may be determined based on which wordlines are expected to be effected by aggressors, rather than a definitive determination of which wordlines are undergoing an increased rate of data decay.

The refresh control circuit 216 may include an aggressor detector circuit that is configured to detect a row hammer attack based on a pattern of repeated access of an aggressor row at a very high rate. In some examples, the aggressor detector circuit may include one or more hash circuits of varying bit sizes (e.g., number of bits in a hash key), which are each configured to hash a received row address with a respective hash key. That is, the aggressor detector circuit may include a first hash circuit configured to may hash the row address into an n-bit hash using an n-but hash key, and a second hash circuit configured to hash the row address into an m-bit hash using an m-bit has key. The aggressor detector circuit may change a first count value associated with the value of the n-bit hash and a second count value associated with the value of the m-bit hash. Based on the value of these counts, the aggressor detector circuit may determine if the row address is suspected of a row hammer attack.

The respective sizes of the hash circuits are smaller than the number of bits of the row address. Because the hash circuits use fewer bits than the row address, hashing of row addresses may lead to collisions, where multiple addresses may be associated with the same hash value (e.g., the same count value). Thus, if the hash keys are known, an attacker may circumvent row hammer detection by sending access requests with row address combinations that circumvent detection. To mitigate against hash key detection, the semiconductor device 200 may include one or more random number generators 230 to generate the hash keys. The random number generators 230 may use a seed value to initiate generation of the hash keys. In some examples, the seed value may be a last-received row address, a value programmed in the mode register or the blow patterns of fuse bank, or some other value.

Typically, the random number generators 230 may generate the hash keys during a power up sequence, or after reset of the semiconductor device 200. However, in some applications, the semiconductor device 200 may remain operational without a power cycle or reset for long periods of time, which may provide an opportunity for an attacker to determine the hash keys. Therefore, in some examples, the random number generators 230 and the aggressor detector circuit of the refresh address control circuit 216 may be configured to generate and implement new hash keys in response to the SREF EXIT signal. Because resetting of the hash keys may result in count values being reset, performing the reset after upon exit from the self-refresh mode may mitigate any previously-perpetuated row hammer attack, as every row will have been recently refreshed. In some other examples, the random number generators 230 may reset the hash keys in response to entering a self-refresh mode, rather than upon exiting a self-refresh mode.

In some examples, to ensure the hash keys values are occasionally updated over a preset time period, a memory controller may issue at least one self-refresh command within a predetermined time period, such as at least once an hour, once every 6 hours, once every 12 hours, once a day, once over a predetermined number of days, once a week, once a month, etc. Forcing updates to hash keys at time predetermined interval may mitigate an ability of an attacker to discover hash keys for use in exploiting the hash circuits and circumventing row hammer attack detection.

As used herein, an activation of a signal may refer to any portion of a signal's waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The power supply terminals are supplied with power supply potentials VDD and VSS. The power supply potentials VDD and VSS are supplied to an internal voltage generator circuit 224. The internal voltage generator circuit 224 generates various internal potentials VPP, VOD, VARY, VPERI, and the like based on the power supply potentials VDD and VSS supplied to the power supply terminals. The internal potential VPP is mainly used in the row decoder 208, the internal potentials VOD and VARY are mainly used in the sense amplifiers SAMP included in the memory array 218, and the internal potential VPERI is used in many peripheral circuit blocks.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 222 so that power supply noise generated by the input/output circuit 222 does not propagate to the other circuit blocks.

Figure 3:
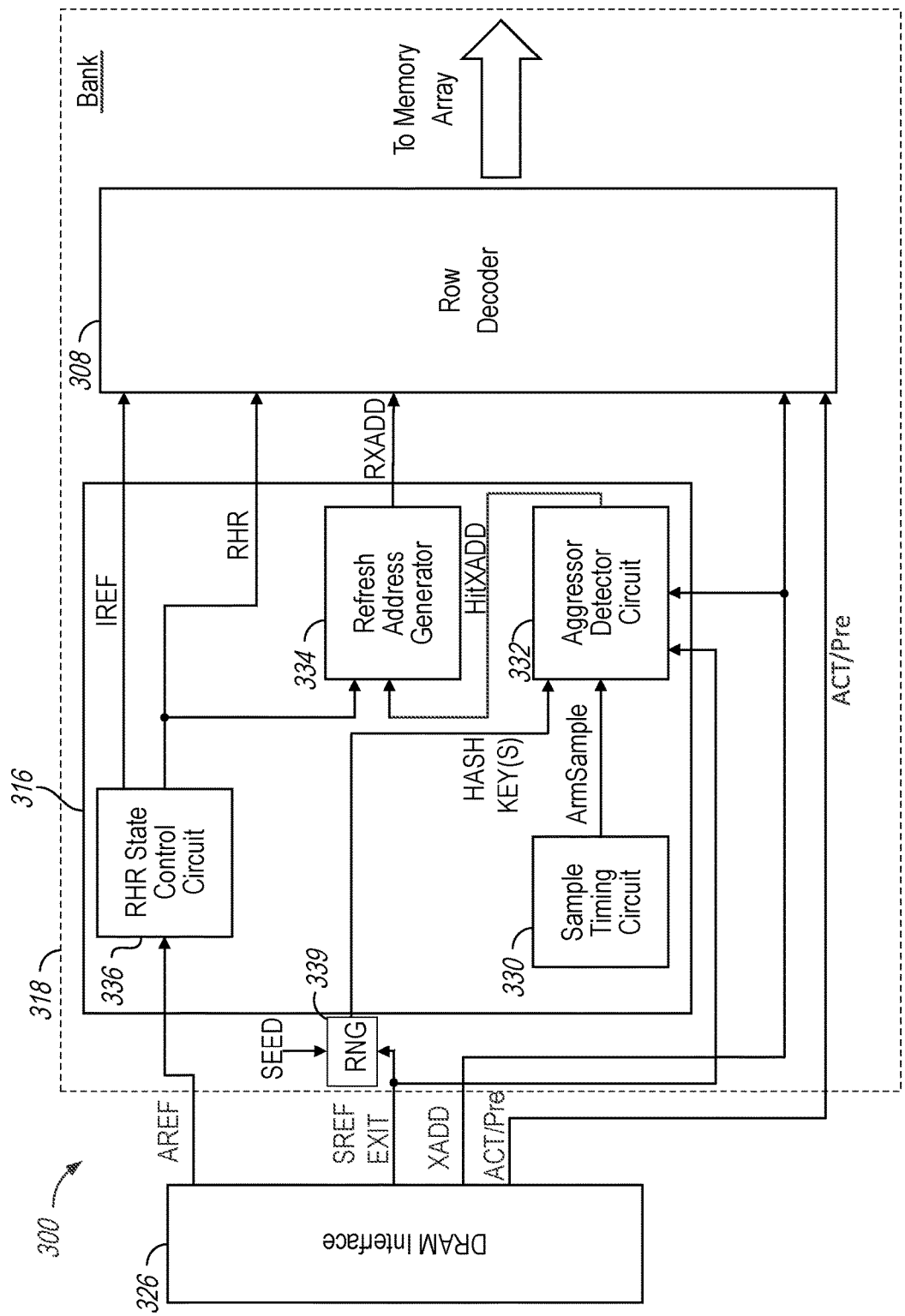
FIG. 3 is a block diagram of a refresh control circuit according to an embodiment of the present disclosure.

FIG. 3 is a block diagram of a refresh control circuit 300 according to an embodiment of the present disclosure. The refresh control circuit 316 may, in some embodiments, be included in the refresh control circuit memory array 116 of FIG. 1. Certain internal components and signals of the refresh control circuit 316 are shown to illustrate the operation of the refresh control circuit 316. The dotted line 318 is shown to represent that in certain embodiments, each of the components (e.g., the refresh control circuit 316 and row decoder 308) may correspond to a particular bank of memory, and that these components may be repeated for each of the banks of memory. Thus, there may be multiple refresh control circuits 316 and row decoders 308. For the sake of brevity, only components for a single bank will be described.

A DRAM interface 326 may provide one or more signals to an address refresh control circuit 316 and row decoder 308. The refresh control circuit 316 may include a sample timing circuit 330, an aggressor detector circuit 332, a row hammer refresh (RHR) state control circuit 336 and a refresh address generator 334. The DRAM interface 326 may provide one or more control signals, such as a refresh signal AREF, a self-refresh exit signal SREF EXIT, activation and pre-charge signals ACT/Pre, and a row address XADD. The refresh control circuit 316 provides refresh address RXADD with timing based on the refresh signal AREF when the bank associated with the refresh control circuit 316 is in the refresh mode. The refresh control circuit may also provide the refresh address RXADD (and other signals) to indicate a panic targeted refresh based on a pattern of accesses to the bank of the memory.

In the example embodiment of FIG. 3, the aggressor detector circuit 332 may sample the current row address XADD responsive to an activation of an optional sampling signal Arm Sample provided by the sample timing circuit 330. The aggressor detector circuit 332 may be coupled to all of the row addresses XADD sent along the row address bus, but may only receive (e.g., process, pay attention to) the current value of the row address XADD when there is an activation of the sampling signal Arm Sample. In other example embodiments sampling may not be used.

In some examples, the aggressor detector circuit 332 may include one or more hash circuits of varying bit sizes (e.g., number of bits in a hash key), which are each configured to hash a received row address with a respective hash key in response to the Arm Sample signal. That is, the aggressor detector circuit 332 may include a first hash circuit configured to may hash the row address into an n-bit hash using an n-bit hash key, and a second hash circuit configured to hash the row address into an m-bit hash using an m-bit has key. The aggressor detector circuit 332 may change a first count value associated with the value of the n-bit hash and a second count value associated with the value of the m-bit hash. Based on the value of these counts, the aggressor detector circuit 332 may determine if the row address is suspected of a row hammer attack. In response to detection of row hammer attack, the aggressor detector circuit 332 may provide the matched aggressor HitXADD signal.

The respective sizes of the hash circuits are smaller than the number of bits of the row address. Because the hash circuits use fewer bits than the row address, hashing of row addresses may lead to collisions, where multiple addresses may be associated with the same hash value (e.g., the same count value). Thus, if the hash keys are known, an attacker may circumvent row hammer detection by sending access requests with row address combinations that circumvent detection. To mitigate against hash key detection, the random number generators 339 may generate the hash keys using random numbers. The random number generators 339 may use a seed value to initiate generation of the hash keys.

In some examples, the seed value may be a last-received row address, a value programmed in the mode register or a fuse bank, or some other value.

Typically, the random number generators 339 may generate the hash keys during a power up sequence, or after reset of the semiconductor device 100. In addition, the random number generators 339 and the aggressor detector circuit 332 may be configured to generate and implement new hash keys in response to the SREF EXIT signal. Because resetting of the hash keys may result in count values being reset, performing the reset after upon exit from the self-refresh mode may mitigate any previously-perpetuated row hammer attack, as every row will have been recently refreshed. In some other examples, the random number generators 339 may reset the hash keys in response to entering a self-refresh mode, rather than upon exiting a self-refresh mode.

In some examples, to ensure the hash keys values are occasionally updated over a preset time period, a memory controller may issue at least one self-refresh command within a predetermined time period, such as at least once an hour, once every 6 hours, once every 12 hours, once a day, once over a predetermined number of days, once a week, once a month, etc. Forcing updates to hash keys at time predetermined interval may mitigate an ability of an attacker to discover hash keys for use in exploiting the hash circuits and circumventing row hammer attack detection.

The RHR state control circuit 336 may provide the signal RHR to indicate that a row hammer refresh (e.g., a refresh of the victim rows corresponding to an identified aggressor row) should occur. The RHR state control circuit 336 may also provide an internal refresh signal IREF, to indicate that an auto-refresh should occur.

Responsive to an activation of RHR or IREF, the refresh address generator 334 may provide a refresh address RXADD, which may be an auto-refresh address or may be one or more victim addresses corresponding to victim rows of the aggressor row corresponding to the aggressor match address HitXADD. The RHR state control circuit 336 may provide a set of activations of RHR and IREF responsive to the refresh signal AREF. The row decoder 308 may perform a refresh operation responsive to the refresh address RXADD and the row hammer refresh signal RHR. The row decoder 308 may perform an auto-refresh operation based on the refresh address RXADD and the internal refresh signal IREF.

The DRAM interface 326 may represent one or more components which provides signals to components of the bank. In some embodiments, the DRAM interface 326 may represent a memory controller coupled to the semiconductor memory device (e.g., semiconductor device 200 of FIG. 2). In some embodiments, the DRAM interface 326 may represent components such as the command address input circuit 202, the address decoder 204, and/or the command decoder 206 of FIG. 2. The DRAM interface 326 may provide a row address XADD, the refresh signal AREF, and access signals such as an activation signal ACT and a pre-charge signal Pre. Although not shown in FIG. 3, the DRAM interface 326 may also provide a bank address BADD, which may indicate which bank the accessed row address XADD is located in. The bank address BADD may activate a particular refresh control circuit 316 associated with the bank indicated by the bank address BADD. The DRAM interface may also put the refresh control circuit into a refresh mode by providing activations of the refresh signal AREF. The refresh signal AREF may be a periodic signal provided during a refresh mode which may indicate a timing for refresh operations. The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

In the example embodiment of FIG. 3, the refresh control circuit 316 uses sampling to monitor a portion of the row addresses XADD provided along the row address bus. Accordingly, instead of responding to every row address, the refresh control circuit 316 may sample the current value of the row address XADD on the row address bus, and may determine which addresses are aggressors based on the sampled row addresses. The timing of sampling by the refresh control circuit 316 may be controlled by the sample timing circuit 330 which provides the sampling signal Arm Sample. The sample timing circuit 330 may provide activations of the sampling signal Arm Sample, and each activation of the signal Arm Sample may indicate that a current value of the row address should be sampled. An activation of Arm Sample may be a 'pulse', where Arm Sample is raised to a high logic level and then returns to a low logic level. The activations of the signal Arm Sample may be provided with periodic timing, random timing, semi-random timing, pseudo-random timing, or combinations thereof. In some embodiments, the timing of the signal Arm Sample may be based, in part, on one or more other signals, such as access signals ACT/Pre. In other embodiments, sampling may not be used, and the aggressor detector circuit 332 may receive every value of the row address XADD along the row address bus. In such embodiments, the sample timing circuit 330 and the sampling signal Arm Sample may be omitted.

The aggressor detector circuit 332 may receive the row address XADD from the DRAM interface 326 and the signal Arm Sample from the sample timing circuit 330. The row address XADD on the row address bus may change as the DRAM interface 326 directs access operations (e.g., read and write operations) to different rows of the memory cell array (e.g., memory cell array 118 of FIG. 1). Each time the aggressor detector circuit 332 receives an activation (e.g., a pulse) of the signal Arm Sample, the aggressor detector circuit 332 may sample the current value of XADD.

The aggressor detector circuit 332 may determine aggressor addresses based on one or more of the sampled row addresses, and then may provide the determined aggressor address as the match address HitXADD. The aggressor detector circuit 332 may include one or more hash circuits configured to store hash keys, which are hashed with the received address to provide a hash value. A count value associated with the hash value is updated, and once a count value exceeds a threshold, the aggressor detector circuit 332, the match address HitXADD.

The memory device may carry out a sequence of refresh operations in order to periodically refresh the rows of the memory device as part of a refresh mode. The RHR state control circuit 336 may determine if a given refresh operation is an auto-refresh operation or a targeted refresh operation. The RHR signal may be generated in order to indicate that the device should refresh a particular targeted row (e.g., a victim row) instead of an address from the sequence of auto-refresh addresses. The RHR state control circuit 236 may also provide an internal refresh signal IREF, which may indicate that an auto-refresh operation should take place. In some embodiments, the signals RHR and IREF may be generated such that they are not active at the same time (e.g., are not both at a high logic level at the same time). In some embodiments, IREF may be activated for every refresh operation, and an auto-refresh operation may be performed unless RHR is also active, in which case a targeted refresh operation is performed instead. The RHR state control circuit may perform a sequence of auto-refresh operations and targeted refresh operation responsive to one or more activations of the refresh signal AREF.

In some embodiments, the refresh control circuit 316 may perform multiple refresh operations responsive to each activation of the refresh signal AREF. For example, each time the refresh signal AREF is received, the refresh control circuit 316 may perform K different refresh operations, by providing K different refresh addresses RXADD. Each refresh operation may be referred to as a 'pump'. Each of the K different refresh operations may be an auto-refresh operation or a targeted refresh operation. In some embodiments, the number of targeted and auto-refresh operations may be constant in each group of pumps responsive to an activation of the refresh signal AREF. In some embodiments it may vary.

The refresh address generator 334 may receive the row hammer refresh signal RHR and the match address HitXADD. The match address HitXADD may represent an aggressor row. The refresh address generator 334 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The refresh address generator 334 may determine the value of the refresh address RXADD based on the row hammer refresh signal RHR. In some embodiments, when the signal RHR is not active, the refresh address generator 334 may provide one of a sequence of auto refresh addresses. When the signal RHR is active, the refresh address generator 334 may provide a targeted refresh address, such as a victim address, as the refresh address RXADD. In some embodiments, the refresh address generator 334 may count activations of the signal RHR, and may provide closer victim rows (e.g., HitXADD+/−1) more frequently than victim rows which are further away from the aggressor address (e.g., HitXADD+/−2).

The row decoder 308 may perform one or more operations on the memory array (not shown) based on the received signals and addresses. For example, responsive to the activation signal ACT and the row address XADD (and IREF and RHR being at a low logic level), the row decoder 308 may direct one or more access operations (for example, a read operation) on the specified row address XADD. Responsive to the RHR signal being active, the row decoder 308 may refresh the refresh address RXADD.

Figure 4:
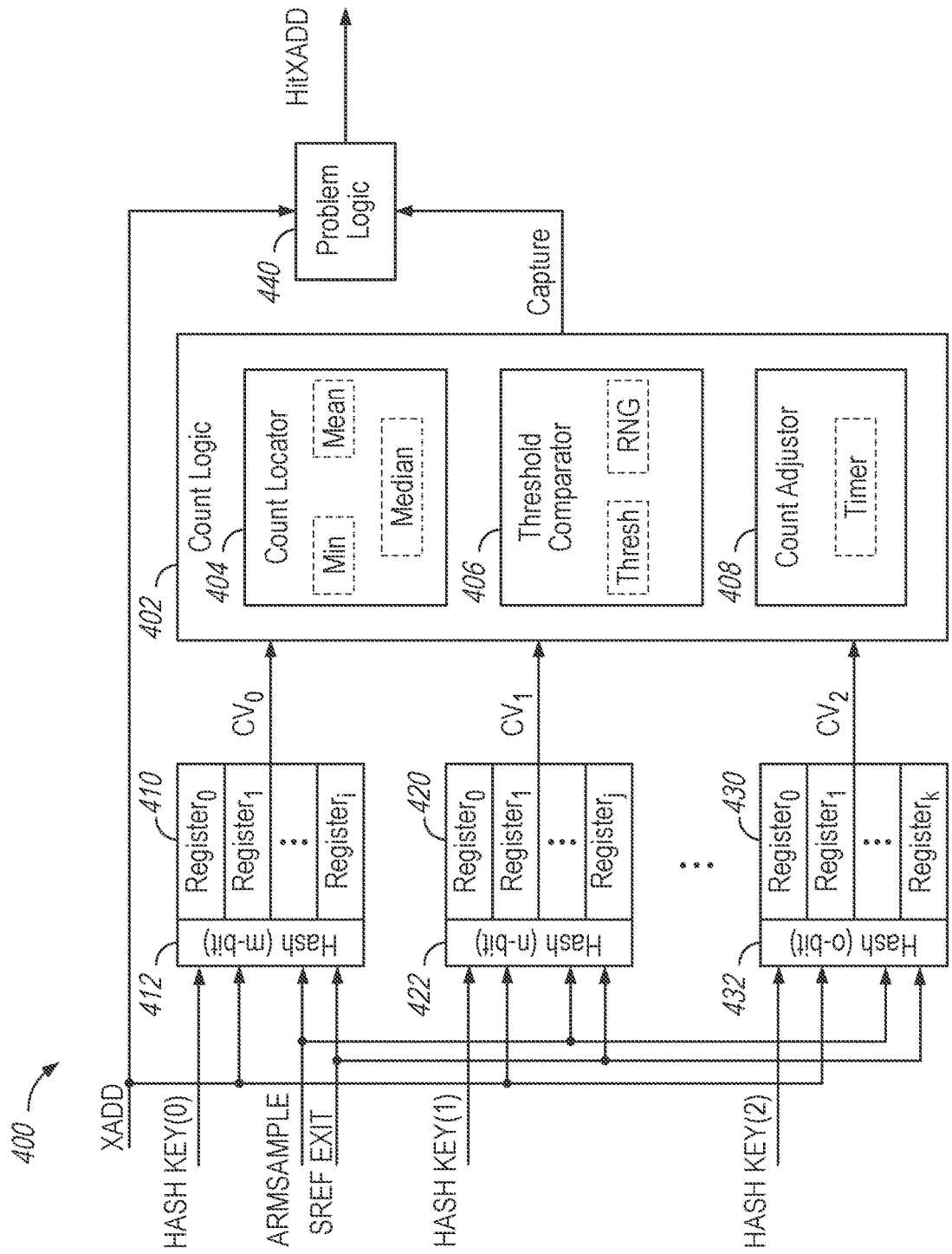
FIG. 4 is a block diagram of an aggressor detector circuit according to an embodiment of the disclosure.

FIG. 4 is a block diagram of an aggressor detector circuit 400 according to an embodiment of the disclosure. The aggressor detector circuit 400 may, in some embodiments, be included in the random number generators 112 of FIG. 1, the refresh control circuit 216 of FIG. 2, the aggressor detector circuit 332 of FIG. 3, or any combination thereof.

The aggressor detector circuit 400 includes a number of hash circuits, 412, 422, and 432, each which hashes a row address XADD along the row address bus a sample signal Arm Sample (e.g., as provided by the sample timing circuit 330 of FIG. 3) is active. Each hash circuit 412, 422, and 432 may change a count value stored in one of the registers of an associated data stack 410, 420, and 430, respectively based on the value of the hash generated by that respective hash circuit 412, 422, and 432. The changed count values (e.g., the count values associated with the row address XADD) may be provided to a count logic circuit 402, which may use the provided count values to determine if the row address XADD is an aggressor row. If the count logic 402 determines that the row address XADD is an aggressor row, then problem logic 440 may provide the aggressor match signal HitXADD, which may be used to initiate a targeted row refresh.

The count logic circuit 402 of FIG. 4 shows a number of sub-components for each of the count locator 404, threshold comparator 406, and count adjustor 408. These sub-components are shown as dotted line boxes, and are optional components of the count logic 402. In some embodiments, the dotted line sub-components may represent system level components of the memory which are coupled to the count logic circuit 402. For example, the timer sub-component may be coupled to a clock signal of the memory (e.g., ICLK of FIG. 1). In some embodiments, the sub-components may represent optional features of the aggressor detector circuit 400 and may be enabled/disabled by user setting (e.g., via mode register setting, via fuses, etc.).

The aggressor detector circuit 400 includes a number of hash circuits such as 412, 422, and 432, each of which is associated with a data stack (e.g., 410, 420, and 430), respectively. Since the hash circuits and data stacks may generally be similar to each other, for the sake of brevity only the first hash circuit 412 and data stack 410 will be described in detail.

The first hash circuit 412 may be an m-bit hash circuit. Responsive to the signal Arm Sample at an active level, the first hash circuit 412 may receive the row address XADD off the row address bus, and may convert it into an m-bit hash value. For example, the row address XADD may be a certain number of bits (e.g., 17 bits). The first hash circuit 412 may hash row address XADD into an m-bit number. The number of bits, m, may generally be less than the number of bits in the unhashed row address XADD. Accordingly, multiple values of the row address XADD may be associated with a given value of the m-bit hash.

The data stack 410 may be any structure capable of storing a number of different count values. For example, the data stack 410 may include a number of registers, each of which may store a count value (e.g., as a binary number). The data stack 410 may hold a number of count values equal to number of possible values of the m-bit hash value (e.g., $2^m$ different count values). For example, if the first hash circuit 412 is an 8-bit hash circuit, then the data stack 410 may include 256 different count values. Accordingly, each count value may be associated with one of the values of the m-bit hash value.

When the hash circuit 412 receives the row address XADD, it may provide an m-bit hash value associated with a value of the row address XADD. Responsive to the m-bit hash value, the count value in the data stack 410 associated with that value of the m-bit hash value may be changed (e.g., incremented). In some embodiments, the count value $CV_0$ associated with the value of the m-bit hash (e.g., associated with the row address XADD) may be provided to a count logic circuit 402, which may change the count value $CV_0$ and then rewrite it into the data stack 410.

The different hash circuits 412, 422, and 432 may be independent of each other. Accordingly, a given row address may be hashed into a first value by the first hash circuit 412, and into a second hash value by the second hash circuit 422. The first hash value and the second hash value are not necessarily the same value (although they may be). Since the hash values act as indices for the count value, this means that each count value may be associated with a different set of row addresses.

The different hash circuits 412, 422, and 432 may all generate different lengths of hash. For example, the first hash circuit 412 may be an m-bit hash circuit, the second hash circuit 422 may be an n-bit hash circuit, and the third hash circuit 432 may be an o-bit hash circuit, where m, n, and o are different numbers. Accordingly, the associated data stacks 410, 420, and 430 may hold different numbers of count values. For example m may be an 8 bit hash, and the first data stack 410 may hold 256 count values, n may be 7 and the second data stack 420 may hold 128 different count values, and o may be 6 and the third data stack 430 may hold 64 different count values. Different lengths of hash may be used in other example embodiments. The use of different hashes means that each count value may be associated with different numbers of row addresses.

The hash circuits 412, 422, and 432 may each receive a respective hash key via respective hash key signals HASH KEYS(0)-(2), respectively, which may determine, in part, the value of the hash generated responsive to a received row address. The hash keys may be stored in the memory (e.g., in a set of latches, in a mode register, etc.) and may be received by the hash circuits 412, 422, and 432. In some examples, the hash circuits 412, 422, and 432 are configured to update the stored hash key values with a new respective hash key value received via the HASH KEY(0)-(2) signals in response to the self-refresh exit signal SREF EXIT. In addition, all stored count values may be cleared when the hash keys are updated.

Each hash circuit may receive a hash key which have a length based on length of the hash value, and there may be a number of hash keys based on a number of bits in the received row address. For example, if the row address is R bits long, then the first hash circuit 412 may receive a first set of hash keys which includes R individual keys, each of which is an m-bit binary number. The second hash circuit 422 may receive a second set of hash keys which includes R individual keys, each of which is an n-bit binary number. The third hash circuit 432 may receive a third set of hash keys which includes R individual keys, each of which is o-bit binary number.

In some embodiments, each set of hash keys may be independent from each other. In some embodiments, one or more individual keys may be shared between the sets of keys, but may be truncated to account for the different lengths of hash output. In some embodiments, the hash keys provided on the HASK KEY(0)-(2) signals may be provided by random number generators (e.g., the random number generators 112 of FIG. 1, the random number generators 230 of FIG. 2, and/or the random number generators 339 of FIG. 3). For example a random number generator may generate the hash keys based on a seed value.

Responsive to a row address XADD, each of the data stacks 410, 420, and 430 may provide a respective count value CV0, CV1, and CV2 to the count logic circuit 402. These count values may be different from each other, because each may be associated with a different set (and a different number) of values of the row address XADD. A count adjustor circuit 408 of the count logic 402 may update the received values, for example by incrementing them. In some embodiments, how the count adjustor 408 changes the count values CV0 to CV2 may be partially dependent on the values of the count values CV0 to CV2. For example, the count value CV1 may only be changed (e.g., incremented) if the value CV0 is above a threshold (e.g., has reached a maximum value).

In some embodiments, the count adjustor circuit 408 may periodically change the count values in a different direction (e.g., decrease them). For example, after a set period of time (e.g., a certain number of clock cycles), the count adjustor 408 may change (e.g., decrease) all of the count values stored in the data stacks 410, 420, and 430. In some embodiments, the count adjustor 408 may reduce the count values to a minimum value by resetting them (e.g., to 0).

A count locator circuit 404 may select one of the received counts, or may synthesize a new value based on the set of count values CV0 to CV2. The count locator circuit 404 may use one or more statistics based on the set of count values CV0 to CV2. For example, the count locator circuit 404 may compare the count values CV0 to CV2 and take the minimum. The count locator circuit 404 may also generate a statistic based on the set of count values, and may, for example, provide the mean or median value of CV0 to CV2. In some embodiments, only one of the minimum, median, and mean may be provided. In some embodiments, a user may be able to select which statistic is used. In some embodiments, all three of the minimum, median, and mean may be calculated and output by the count locator, and may be used separately. Other statistics may be used in other example embodiments.

In some embodiments, rather than using a statistic, the count locator 404 may select one of the count values CV0 to CV2. For example, in embodiments there each count value is changed only if a previous count value is above a threshold (e.g., CV1 is changed if CV0 is greater than a threshold), then a particular count value (e.g., CV2) may be provided by the count locator 404. In some embodiments, which count value is used may be changed periodically. For example a count value may be randomly selected.

The count locator circuit 404 may provide the statistic (e.g., the minimum) to a threshold comparator circuit 406. The threshold comparator circuit 406 may compare the received statistic to a threshold value Thresh. If the threshold comparator circuit 406 determines that the received statistic is greater than the value Thresh, then the count logic circuit 402 may provide a capture signal Capture at an active level (e.g., a high logical level, a pulse, a rising edge, etc.). In some embodiments, the threshold may be periodically changed. For example, the threshold Thresh may be randomly varied based on the output of a random number generator RNG.

A problem logic circuit 440 may receive the signal Capture. When the signal Capture is active, the problem logic circuit 440 may provide the match signal HitXADD at an output having a value indicating a match.

Figure 5:
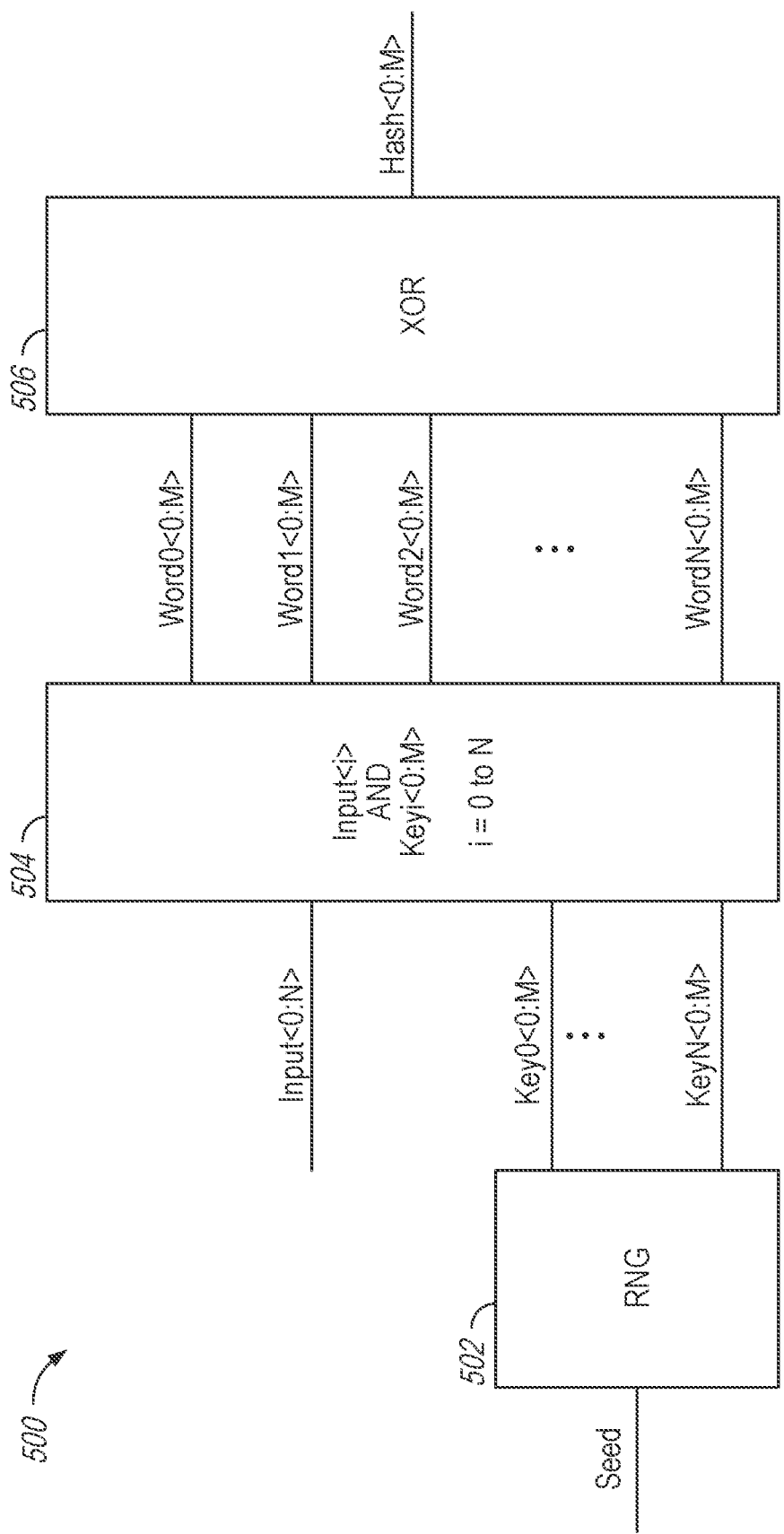
FIG. 5 is a block diagram of a hash circuit according to an embodiment of the disclosure.

FIG. 5 is a block diagram of a hash circuit 500 according to an embodiment of the disclosure. The hash circuit 500 may, in some embodiments, be used as the hash circuits 412, 422, and/or 432 of FIG. 4. The hash circuit 500 of FIG. 5 represents a simplified view of the operation of a hash circuit, in order to explain the general operation of a hash circuit. Hash circuits of the present disclosure may use more complicated logic and/or other processes to convert the input signal into the hash.

The hash circuit 500 of FIG. 5 is shown as including a random number generator (RNG) 502 (e.g., the random number generators 112 of FIG. 1, the random number generators 230 of FIG. 2, the random number generators 339 of FIG. 3), which may be used to generate the set of hash keys Key based on a seed value Seed. In the embodiment of FIG. 5, the RNG 502 may be included in the hash circuit 500, and the hash circuit may directly receive the seed value Seed in order to generate a set of keys. In some embodiments, the RNG 502 may be a system level component, and may not be included in each individual hash circuit. In some embodiments, the RNG 502 may be omitted and other methods may be used to generate the keys Key.

The hash circuit 500 may receive an input value Input, which may be an N+1 bit number (e.g., Input<0:N>). In some embodiments, the value Input may be a row address. The hash circuit 500 may generate an output value Hash, which may be an M+1 bit number (e.g., Hash<0:M>. The value M may generally be a smaller number than the value N.

The RNG 502 generates a set of keys which is based on the values N and M. Specifically, the RNG 402 generates N+1 keys, each of which is of length M+1. Block 504 may combine each key from the set of keys with a bit of the input value. For example, each bit of the input value (e.g., Input<i>) may be combined with a corresponding one of the keys Ki<0:M> to generate a Word. So a first bit may be combined with a first key, and so forth. In the example of FIG. 5, AND logic may be used to combine each bit of the input with the associated key. Each word may be an M+1 bit length and after combining each bit of the Input with the associated key, there may be a set of N+1 words.

Block 506 may combine the words together to generate the output Hash. In the example of FIG. 5, XOR logic may be used to combine all of the Words together. Once the words have been combined, the output may be an output value Hash which is M+1 bits in length.

Figure 6:
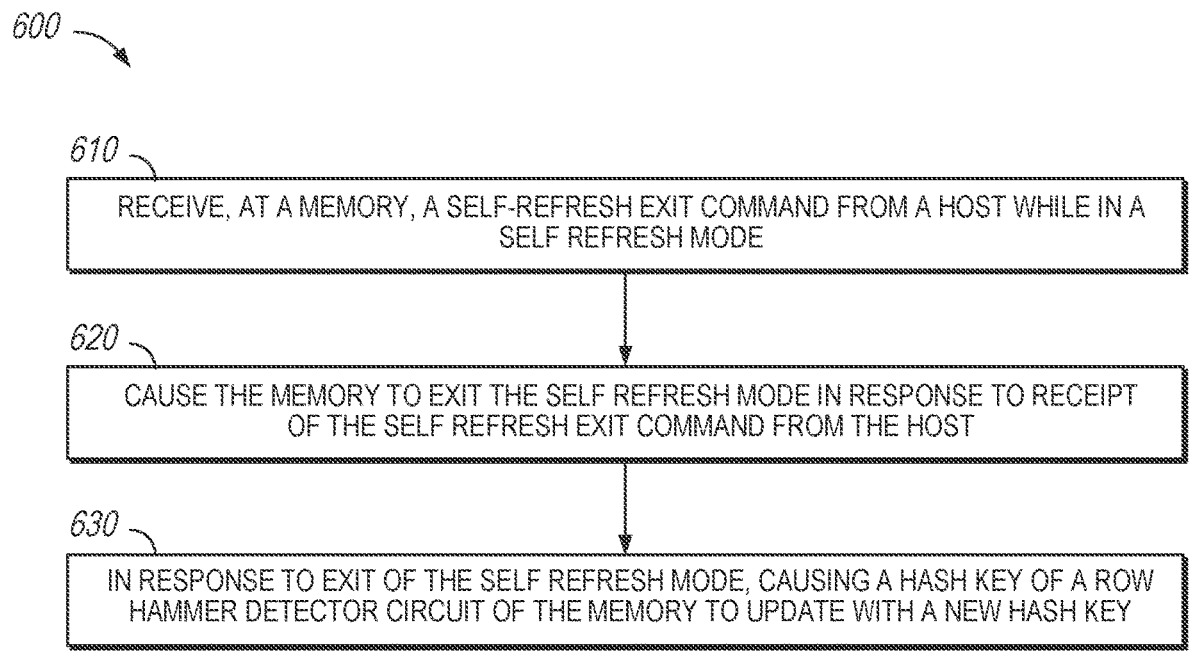
FIG. 6 is a block diagram of a method to reset a row hammer detector circuit according to an embodiment of the disclosure.

FIG. 6 is a block diagram of a method to reset a row hammer detector circuit according to an embodiment of the disclosure. The method 600 may, in some embodiments, be implemented by one or more of the components discussed in FIGS. 1-5. While a certain sequence of operations is discussed with respect to the method 600, it should be understood that certain operations may be performed in a different order, repeated, and/or omitted in other embodiments. Certain steps may happen simultaneous to each other in some embodiments.

The method 600 may include receiving, at a memory, a self-refresh exit command from a host while in a self-refresh mode, at 610. The method 600 may further include causing the memory to exit the self-refresh mode in response to receipt of the self-refresh exit command, at 620. The memory may include the memory 110 of FIG. 1 and/or the semiconductor device of FIG. 2.

The method 600 may further include, in response to exit of the self-refresh mode, causing a hash key of a row hammer detector circuit of the memory to update with a new hash key, at 630. The row hammer detector circuit may include the row hammer detector circuit 114 of FIG. 1, an aggressor detector circuit of the refresh control circuit memory array 116 of FIG. 2, the aggressor detector circuit 332 of FIG. 3, the aggressor detector circuit 400 of FIG. 4, or combinations thereof. The hash key may be associated with a hash circuit of the row hammer detector circuit, such as any of the hash circuits 412, 422, or 432 of FIG. 4. In some examples, the method 600 may further include causing a random number generator of the memory to provide the new hash key in response to exit from the self-refresh mode. The random number generator may include the random number generators 112 of FIG. 1, the random number generators 230 of FIG. 2, the random number generators 339 of FIG. 3, or any combination thereof. In some examples, the hash key and the new has key each have fewer bits than a row address of the memory.

In some examples, the method 600 may include entering the self-refresh mode in response to receipt of a self-refresh command from a host. The host may include the host controller 104 of FIG. 1. In some examples, the method 600 may include stopping read and write access operations of a memory array of the memory while in the self-refresh mode. In some examples, the method 600 may further include, while in the self-refresh mode, refreshing each row of memory cells of a bank of a memory array of the memory.

In some examples, the method 600 may further include prior, to entering the self-refresh mode, causing a targeted refresh of a victim row of memory cells of a memory array of the memory in response to detection of a row hammer attack based on a hash between the hash key and an address corresponding to an aggressor row of memory cells adjacent the victim row of memory cells. The memory array may include the memory array 116 of FIG. 1 and/or the memory cell array 218 of FIG. 2.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a row hammer detector circuit comprising a hash circuit configured to store a hash key and provide a first count value based on a hash between the hash key and a row address corresponding to a row of memory cells of a memory array, wherein the row hammer detector circuit is configured to provide a match signal in response to the count value exceeding a threshold to cause a targeted refresh of a victim row adjacent the row of memory cells, wherein, in response to exit from a self-refresh mode, the hash circuit is configured to update the stored hash key with a new hash key.

2. The apparatus of claim 1, further comprising a random number generator configured to provide the new hash key in response to exit from the self-refresh mode.

3. The apparatus of claim 1, further comprising the memory array configured to store information in the row of memory cells.

4. The apparatus of claim 1, further comprising a command decoder configured to exit the self-refresh mode in response to a self-refresh exit command received from a host.

5. The apparatus of claim 4, wherein the command decoder configured to enter the self-refresh mode in response to a self-refresh command received from the host.

6. The apparatus of claim 1, further comprising the memory array comprising a bank including the row of memory cells, wherein, during while in the self-refresh mode, the memory array is configured to refresh each row of memory cells of the bank.

7. The apparatus of claim 1, wherein the hash key has fewer bits than the row address.

8. The apparatus of claim 1, wherein the row hammer detector circuit further comprising a second hash circuit configured to store a second hash key and provide a second count value based on a hash between the second hash key and the row address, wherein the row hammer detector circuit is configured to provide the match signal in response to the second count value exceeding the threshold to cause the targeted refresh of the victim row adjacent the row of memory cells.

9. The apparatus of claim 8, wherein the hash key has a different number of bits than the second hash key.

10. The apparatus of claim 8, wherein, in response to exit from the self-refresh mode, the second hash circuit is configured to update the stored second hash key with a second new hash key.

11. An apparatus comprising:
a memory array comprising a plurality of rows of memory cells;
a command decoder configured to receive a self-refresh command from a host, wherein the command decoder is configured to enter a self-refresh mode in response to the self-refresh command, wherein, while in the self-refresh mode, the command decoder is configured to cause each of the plurality of memory cells to refresh and to ignore memory access requests, wherein the command decoder is configured to exit the self-refresh mode in response to a self-refresh exit command from the decoder; and
a row hammer detector circuit configured to cause a targeted refresh of a victim row of memory cells of the plurality of rows of memory cells in response to detection of a row hammer attack based on a hash between a hash key and an address corresponding to an aggressor row of memory cells of the plurality of memory cells adjacent the victim row of memory cells, wherein the row hammer detector circuit is configured to update the hash key with a new hash key in response to exit of the self-refresh mode.

12. The apparatus of claim 11, wherein the row hammer detector circuit is configured to detect the row hammer attack based on a count value associated with the hash exceeding a threshold value.

13. The apparatus of claim 12, wherein the row hammer detector circuit is configured to reset the count value in response to exit of the self-refresh mode.

14. The apparatus of claim 11, further comprising a random number generator configured to provide the new hash key.

15. The apparatus of claim 11, wherein the plurality of rows of memory cells includes volatile memory cells.

16. A method comprising:
receiving, at a memory, a self-refresh exit command from a host while in a self-refresh mode;
causing the memory to exit the self-refresh mode in response to receipt of a self-refresh exit command from the host; and
in response to exit of the self-refresh mode, causing a hash key of a row hammer detector circuit of the memory to update with a new hash key.

17. The method of claim 15, further comprising, prior to entering the self-refresh mode, causing a targeted refresh of a victim row of memory cells of a memory array of the memory in response to detection of a row hammer attack based on a hash between the hash key and an address corresponding to an aggressor row of memory cells adjacent the victim row of memory cells.

18. The method of claim 15, further comprising causing a random number generator of the memory to provide the new hash key in response to exit from the self-refresh mode.

19. The method of claim 16, further comprising entering the self-refresh mode in response to receipt of a self-refresh command from the host.

20. The method of claim 16, further comprising stopping read and write access operations of a memory array of the memory while in the self-refresh mode.

21. The method of claim 16, further comprising, while in the self-refresh mode, refreshing each row of memory cells of a bank of a memory array of the memory.

22. The method of claim 16, wherein the hash key and the new has key each have fewer bits than a row address of the memory.

* * * * *